United States Patent [19]
Hsu et al.

[11] Patent Number: 5,804,858
[45] Date of Patent: Sep. 8, 1998

[54] BODY CONTACTED SOI MOSFET

[75] Inventors: Ching-Hsiang Hsu, Chia; Mong-Song Liang, Hsin-Chu, both of Taiwan

[73] Assignee: Taiwan Semiconductor Manufacturing, Ltd., Hsin-Chu, Taiwan

[21] Appl. No.: 721,667

[22] Filed: Sep. 27, 1996

Related U.S. Application Data

[62] Division of Ser. No. 488,683, Jun. 8, 1995, Pat. No. 5,591,650.

[51] Int. Cl.$^6$ .............................. H01L 27/01; H01L 29/76
[52] U.S. Cl. .......................... 257/347; 257/369; 257/372; 257/374
[58] Field of Search .................................... 257/347, 351, 257/369, 374, 66, 372; 437/21, 41, 44

[56] References Cited

U.S. PATENT DOCUMENTS

| | | | |
|---|---|---|---|
| 4,899,202 | 2/1990 | Blake et al. | 357/23.7 |
| 4,906,587 | 3/1990 | Blake | 257/347 |
| 4,965,213 | 10/1990 | Blake | 257/351 |
| 5,160,989 | 11/1992 | Houston | 257/347 |
| 5,185,280 | 2/1993 | Houston et al. | 437/44 |
| 5,278,102 | 1/1994 | Horie | 437/228 |
| 5,298,434 | 3/1994 | Strater et al. | 437/21 |
| 5,341,028 | 8/1994 | Yamaguchi et al. | 257/351 |

FOREIGN PATENT DOCUMENTS

| | | | |
|---|---|---|---|
| 3-120752 | 2/1991 | Japan | 257/351 |

OTHER PUBLICATIONS

"An SOI–DRAM with Wide Operating Voltage Range by CMOS/SIMOX Technology", by K. Suma in IEEE 1994 ISSCC Slide Supplement, pp. 104–105.

*Primary Examiner*—Valencia Martin Wallace
*Attorney, Agent, or Firm*—George O. Saile; Stephen B. Ackerman; Rosemary L. S. Pike

[57] ABSTRACT

A new method of forming a silicon-on-insulator device having a body node contact is described. Active areas are isolated from one another within a silicon-on-insulator layer. Adjacent active areas are doped with dopants of opposite polarities to form at least one n-channel active area and at least one p-channel active area. Gate electrodes are formed over each active area. The area directly underlying the gate electrode and extending downward to the insulator layer comprises the body node. Lightly doped areas are formed beneath the spacers on the sidewalls of the gate electrodes. First ions are implanted into the active areas not covered by a mask whereby source and drain regions are formed in the at least one n-channel active area and whereby a p-channel body contact region is formed within the at least one p-channel active area wherein the p-channel body contact region contacts the p-channel body node. Second ions are implanted into the active areas not covered by a mask whereby source and drain regions are formed in the at least one p-channel active area and whereby an n-channel body contact region is formed within the at least one n-channel active area wherein the n-channel body contact region contacts the n-channel body node. The semiconductor substrate is annealed to complete formation of the silicon-on-insulator device having a body node contact in the manufacture of an integrated circuit.

6 Claims, 5 Drawing Sheets

BODY CONTACTED SOI MOSFET

RELATED PATENT APPLICATION

This application is a division of application Ser. No. 08/488,683 filed Jun. 8, 1995 and now U.S. Pat. No. 5,591,650.

BACKGROUND OF THE INVENTION (1) Field of the Invention

The invention relates to the fabrication of integrated circuit devices, and more particularly, to a method of forming a silicon-on-insulator (SOI) device having a body node contact in the fabrication of integrated circuits.

(2) Description of the Prior Art

FIG. 1 illustrates a floating body silicon-on-insulator (SOI) MOSFET. An insulating layer 12 overlies the silicon semiconductor substrate 10. The body node 13 is formed in a silicon layer overlying the insulator layer 12 as are source and drain regions 11. The body node 13 is floating in that it is electrically isolated from the substrate by the underlying insulator layer 12. CMOS devices fabricated using the SOI structure have the advantage of process simplicity. However, to connect the body of the SOI to an external metal line requires the formation of a body connection to be different from the conventional CMOS process. In SOI devices without body contact, such as illustrated in FIG. 1, holes generated by hot electrons during high voltage operation will diffuse toward the source. As the number of holes increases, the parasitic bipolar transistor will be turned on causing additional current to flow from the source to the drain which in turn causes a "kink" effect in the drain current of the MOSFET.

U.S. Pat. Nos. 5,278,102 to Horie and 5,298,434 to Strater et al show methods to form silicon-on-insulator structures in general. "An SOI-DRAM With Wide Operating Voltage Range By CMOS/SIMOX Technology", by K. Suma in IEEE 1994 ISSCC Slide Supplement, pp. 104–105 shows SOI structures and some problems associated with them. U.S. Pat. No. 4,899,202 to Blake et al describes a silicon-on-insulator transistor with a body node to source node connection.

SUMMARY OF THE INVENTION

A principal object of the present invention is to provide an effective and very manufacturable method of forming a body node contacted silicon in the fabrication of a silicon-on-insulator integrated circuit.

Another object of the present invention is to provide a method of forming a silicon-on-insulator device having a body node contacted in the fabrication of an integrated circuit.

A further object of the present invention is to provide a method of forming a silicon-on-insulator device having a body node contacted in the fabrication of an integrated circuit wherein the width of the current flow is not reduced.

Yet another object of the invention is to provide a method of forming a silicon-on-insulator device having a body node contact formed without sacrificing drain current in the fabrication of an integrated circuit.

In accordance with the objects of this invention the method of forming a silicon-on-insulator device having a body node contact is achieved. A first silicon oxide layer is formed on the surface of a semiconductor substrate. A silicon layer is deposited over the first silicon oxide layer. Active areas within the silicon layer are isolated from one another with isolation areas. Adjacent active areas are doped with dopants of opposite polarities to form at least one n-channel active area and at least one p-channel active area. A gate oxide layer is formed over the surface of the silicon layer. A layer of polysilicon is deposited overlying the gate oxide layer and patterned to form gate electrodes over the active areas wherein in each active area, the portion of the active area directly underlying the gate electrode and extending downward to the first silicon oxide layer comprises the body node. The polysilicon layer remaining is oxidized to form a second silicon oxide layer over all surfaces of the gate electrodes. First spacers are formed on the sidewalls of the gate electrodes. Lightly doped areas are formed beneath the first spacers. A mask is formed over the at least one p-channel active area except for a portion where the body node contact will be formed. First ions are implanted into the active areas not covered by the mask whereby source and drain regions are formed in the at least one n-channel active area and whereby a p-channel body contact region is formed within the at least one p-channel active area wherein the p-channel body contact region contacts the p-channel body node. A mask is formed over the at least one n-channel active area except where the body node contact region is to be formed and is formed over the body node contact of the p-channel region. Second ions are implanted into the active areas not covered by the mask whereby source and drain regions are formed in the at least one p-channel active area and whereby an n-channel body contact region is formed within the at least one n-channel active area wherein the n-channel body contact region contacts the n-channel body node. The semiconductor substrate is annealed to complete formation of the silicon-on-insulator device having a body node contact in the manufacture of an integrated circuit.

Also in accordance with the objects of this invention, a new silicon-on-insulator body node contacted device is described. The device comprises a semiconductor substrate having an insulator layer thereover. A silicon layer overlying said insulator layer comprises isolation areas between active areas. Adjacent active areas have opposite polarities. A polysilicon gate electrode having a gate oxide thereunder and having silicon oxide sidewalls and dielectric spacers on its sidewalls overlies each active area. The portion of each active area directly underlying the gate electrode and extending downward to the insulator layer comprises the body node of the silicon-on-insulator structure. Lightly doped regions lie within the silicon layer underlying the dielectric spacers. The lightly doped regions act as extensions for the source and drain providing for the current to be collected in the area next to the body contact. Source and drain regions lie within the silicon layer on either side of the body node. A body node contact lies within a portion of the source region. Because of the source/drain extensions, the width of the device will not be affected by the presence of the body contact region.

BRIEF DESCRIPTION OF THE DRAWINGS

In the accompanying drawings forming a material part of this description, there is shown.

DESCRIPTION OF THE PREFERRED EMBODIMENTS

Figure 1:
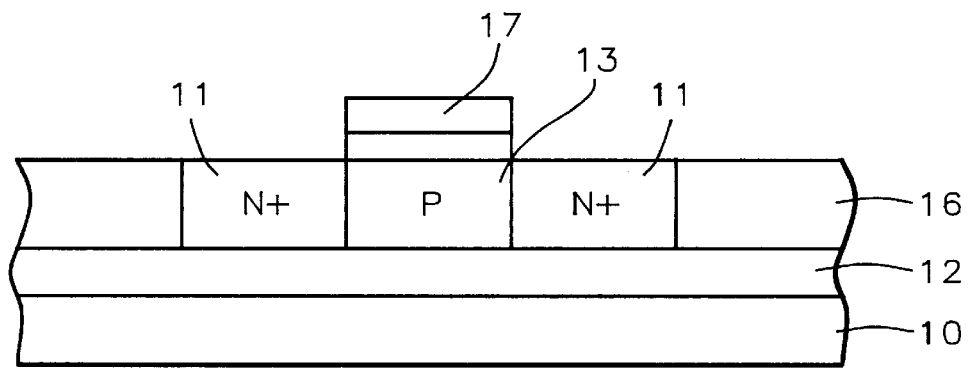
FIG. 1 schematically illustrates in cross-sectional representation a floating body silicon-on-insulator device of the prior art.
Figure 2:
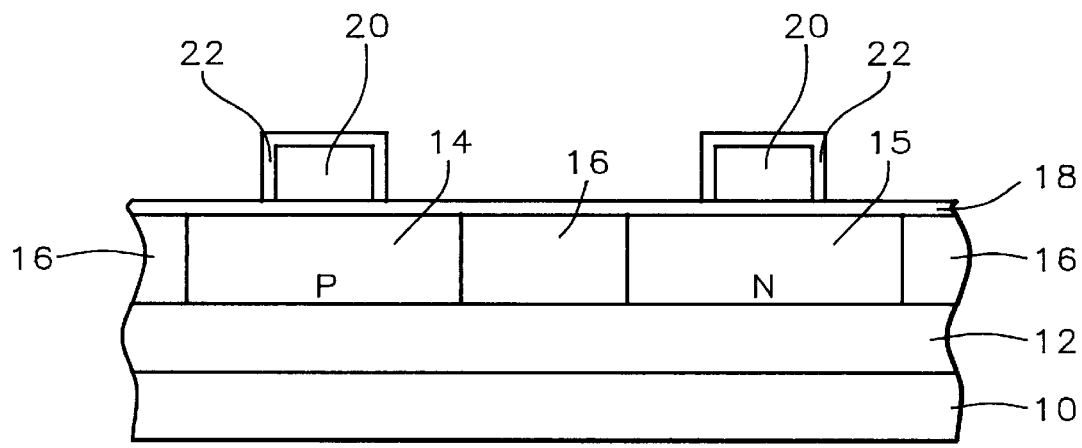
FIGS. 2 through 7 schematically illustrate in cross-sectional representation a preferred embodiment of the present invention.

Referring now more particularly to FIG. 2, there is shown an illustration of a portion of a partially completed integrated circuit in which there is a monocrystalline semiconductor substrate 10. A silicon oxide insulator layer 12 is formed over the surface of the silicon substrate to a thickness of about 3000 Angstroms. A silicon layer is deposited overlying the silicon oxide layer to a thickness of about 1500 Angstroms. Body node regions are formed within the silicon layer by ion implantation. P and N body node regions 14 and 15 have dopant concentrations of about $5 \text{ E } 11$ atoms/cm$^2$. Active areas are isolated from one another by field oxide isolation regions 16.

A layer of gate silicon oxide 18 is deposited over the top surface of the semiconductor substrate to a thickness of between about 70 to 100 Angstroms. A layer of polysilicon is deposited by low pressure chemical vapor deposition (LPCVD) to a thickness of between about 1500 to 2500 Angstroms. The polysilicon is patterned and etched away where it is not covered by a mask forming polysilicon gate electrodes 20 in the active regions. The polysilicon is reoxidized to form silicon oxide layer 22 on all surfaces of the polysilicon gate electrodes 20.

Figure 3:
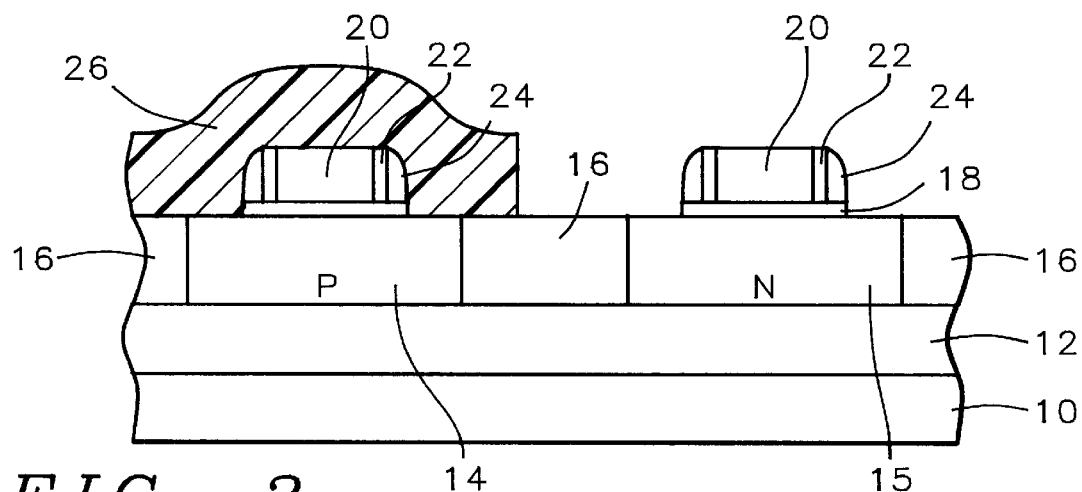

Referring now to FIG. 3, an insulating layer of phosphosilicate glass (PSG) or phosphorus doped oxide is deposited over the surface of the patterned polysilicon gate electrodes. The insulating layer is anisotropically etched leaving the insulating layer on the sidewalls of the polysilicon. The PSG sidewalls 24 are shown in FIG. 3. The anisotropic etch also etches away the oxide layer 22 on the top surface of the polysilicon lines and etches away the gate silicon oxide not covered by the gate electrodes and the PSG sidewalls.

Figure 4:
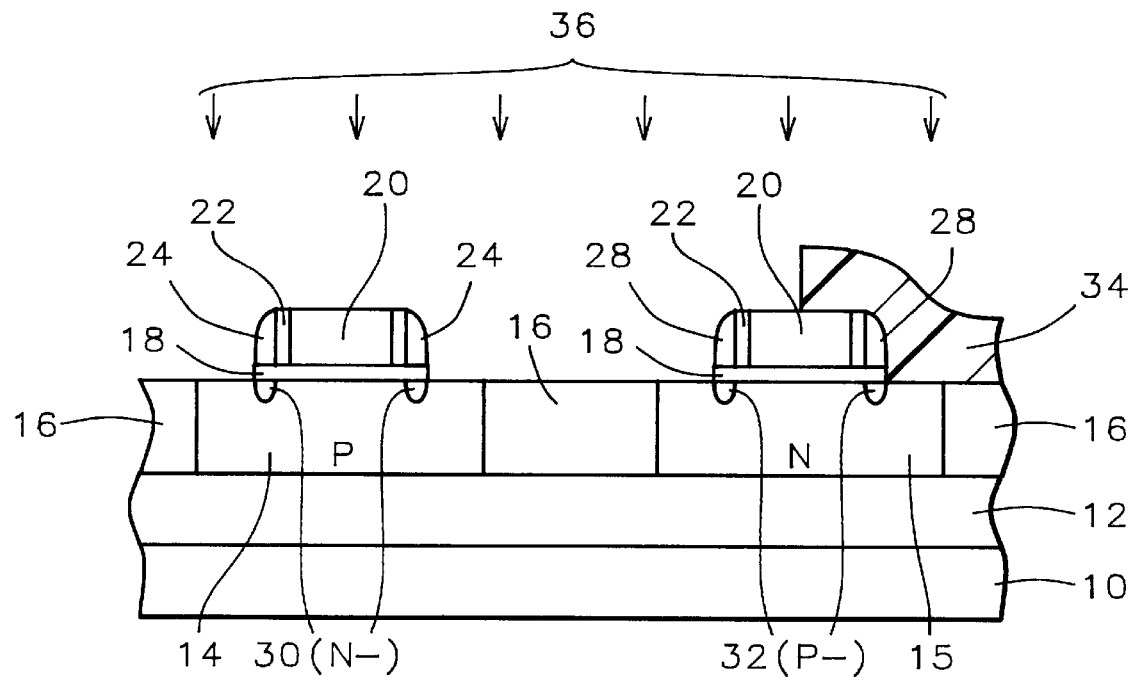

The n-channel region 14 is protected with a coating of photoresist 26. The PSG sidewalls 24 in the unprotected p-channel region 15 are etched away using a wet chemical etch. A layer of borosilicate glass (BSG) or boron doped oxide is deposited over the surface of the substrate and anisotropically etched away to leave sidewalls 28 on the gate electrode 20 in the p-channel region 15, as illustrated in FIG. 4. The mask is removed. The substrate is subjected to, for example, a rapid thermal annealing at about 1000° C. for about 15 seconds. This annealing drives in the dopants from the PSG and BSG sidewalls to form lightly doped source/drain extensions 30 and 32, respectively. Dopant concentrations of these regions are between about $1 \text{ E } 18$ to $1 \text{ E } 19$ atoms/cm$^3$. Alternatively, the source/drain extensions 30 and 32 could be formed by a lightly doped drain (LDD) or large tilt angle implanted drain (LATID) process.

Figure 4A:
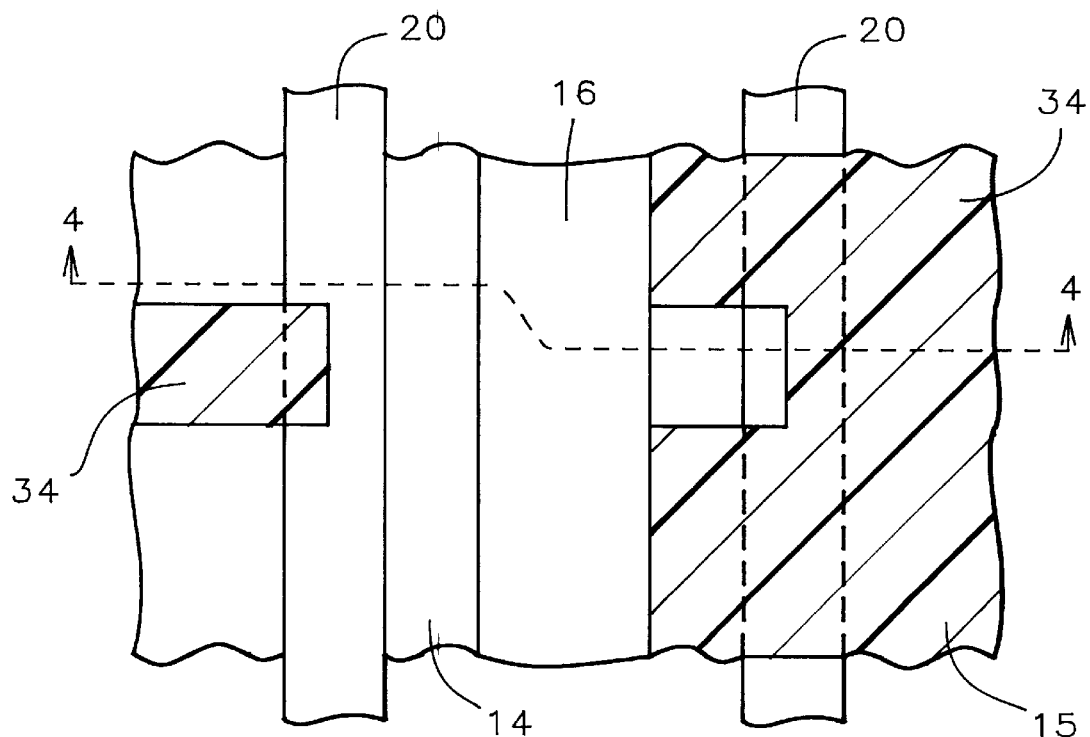
FIGS. 4A, 6A, and 8 schematically illustrate top views of a preferred embodiment of the present invention.
Figure 5:
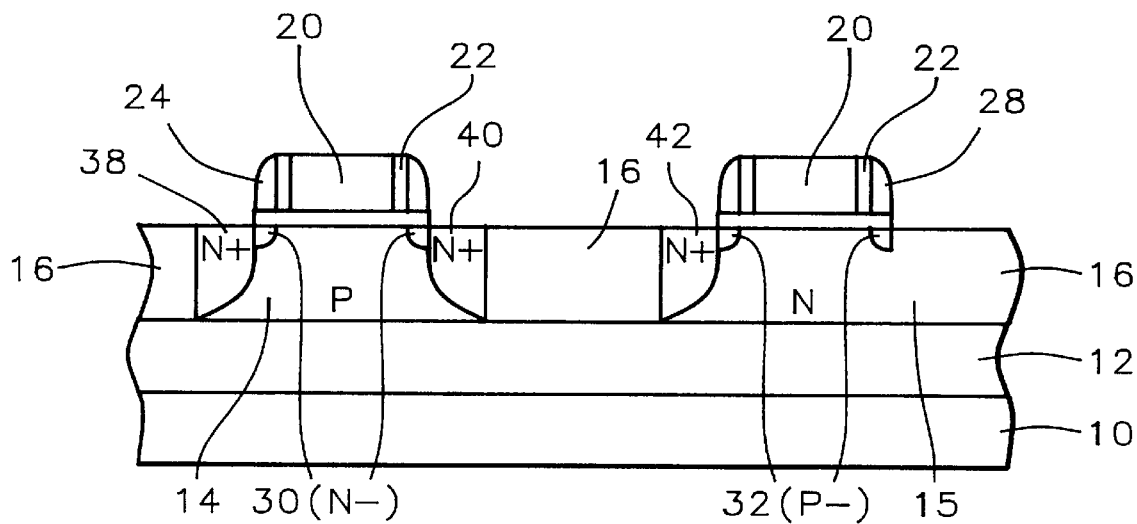

A layer of photoresist is coated over the surface of the substrate and patterned to provide a mask 34 to protect the p-channel region and a portion of the n-channel region, as illustrated in FIG. 4 and in top view in FIG. 4A. Arsenic or phosphorus ions 36 are implanted into the substrate not protected by the photoresist mask 34 to form n-channel source and drain regions 38 and 40, respectively, and p-channel body contacting region 42, as shown in FIG. 5. The ions 36 are implanted at an energy of between about 40 to 50 KeV and a dosage of between about $1 \text{ E } 15$ to $1 \text{ E } 16$ atoms/cm$^2$.

Figure 6:
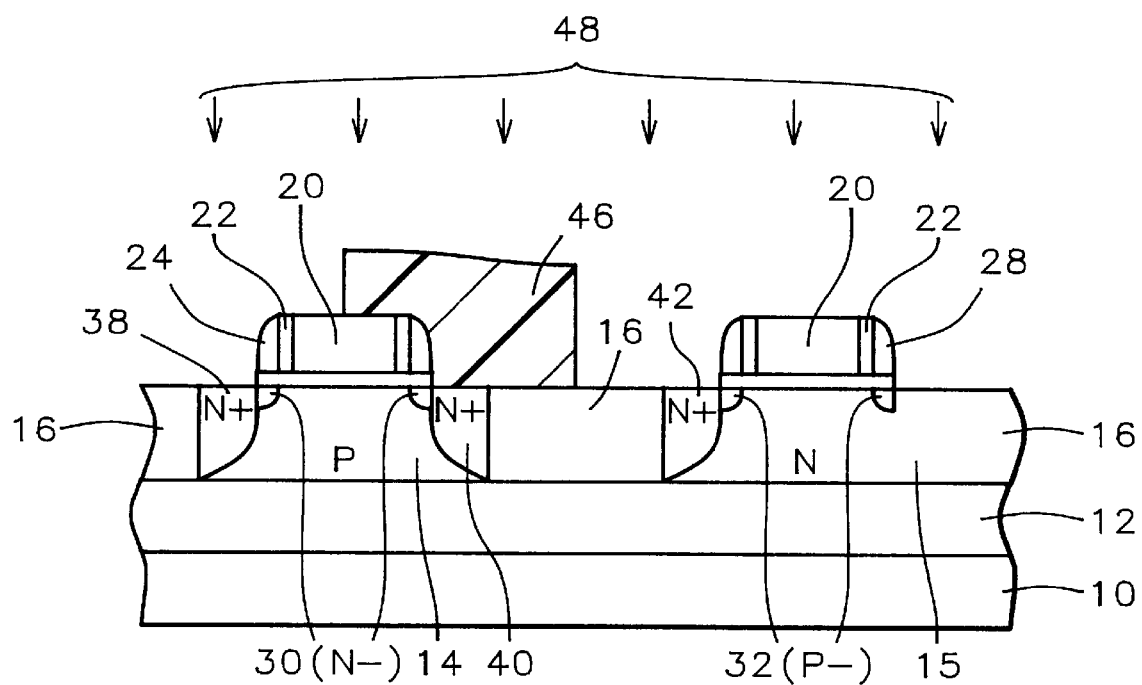
Figure 6A:
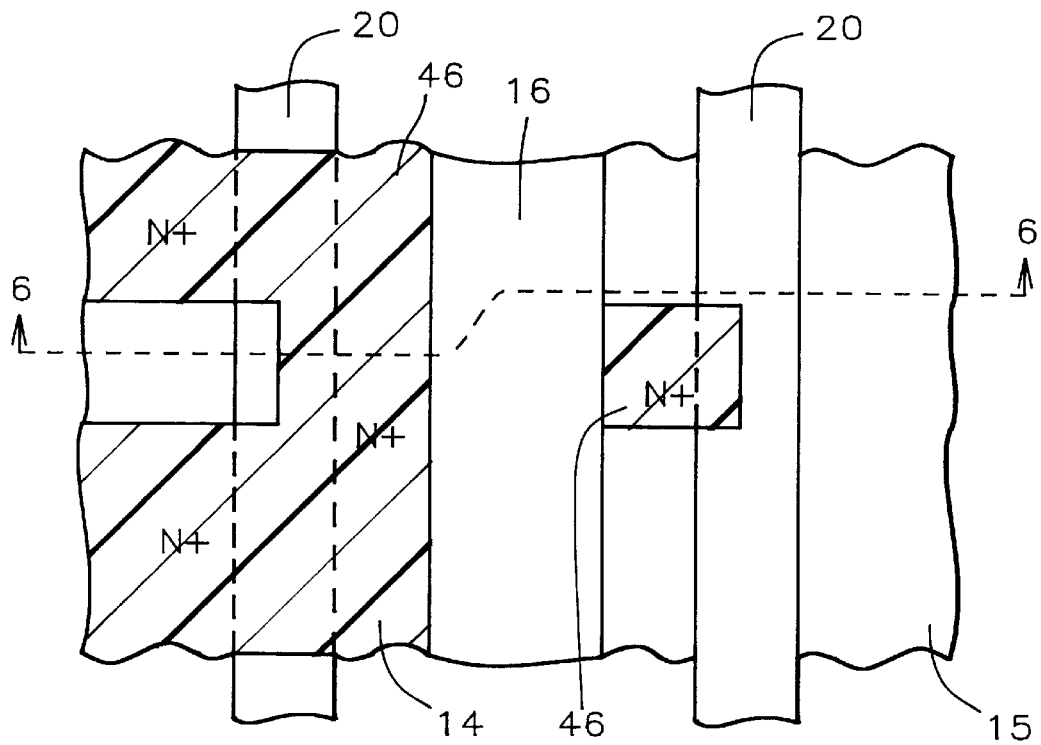
Figure 7:
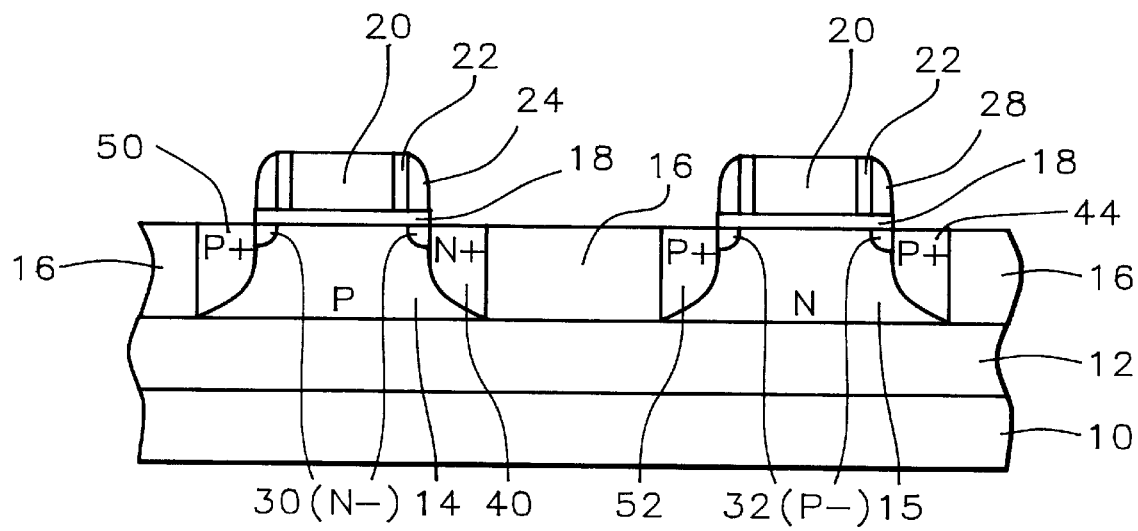

Referring now to FIG. 6, a photoresist mask 46 is formed to protect the n-channel region 14 and a portion of the p-channel region, as illustrated in top view in FIG. 6A. BF$_2$ or boron ions 48 are implanted into the substrate not protected by the photoresist mask 46 to form p-channel source and drain regions 52 and 44, respectively, and n-channel body contact region 50, as shown in FIG. 7. The ions 48 are implanted at an energy of between about 50 to 60 KeV and a dosage of between about $1 \text{ E } 15$ to $1 \text{ E } 16$ atoms/cm$^2$. The order of source and drain implantations may, of course, be reversed. The body contact regions 50 and 42 serve to connect the body node region to the source region.

Figure 8:
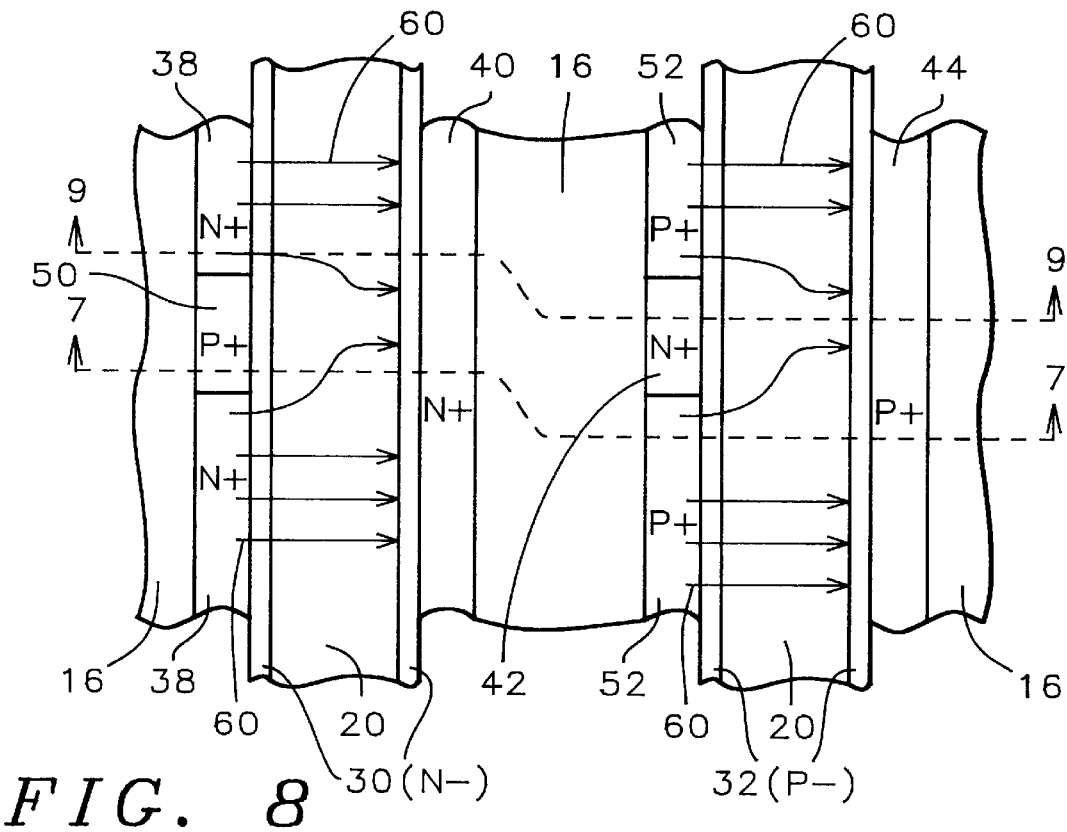
Figure 9:
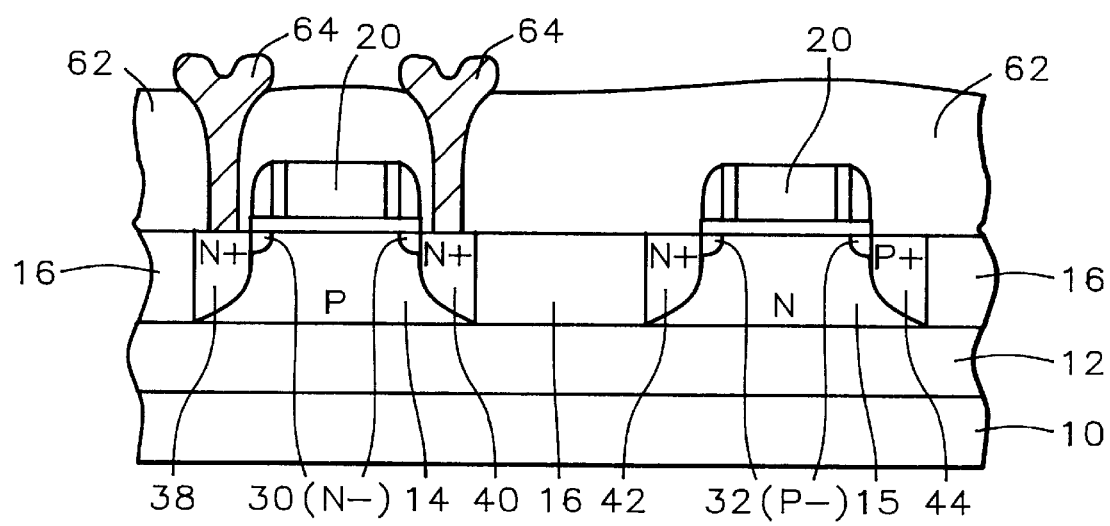
FIG. 9 schematically illustrates in cross-sectional representation a completed silicon-on-insulator body contacted device of the present invention.

FIG. 8 illustrates a top view of the n and p-channel silicon-on-insulator MOSFET after the body contact ion implant is complete. FIGS. 7 and 9 illustrate cross-sectional views 7—7 and 9—9, respectively.

The semiconductor substrate is annealed at a temperature of between about 900° to 950° C. for a duration of between about 20 to 30 minutes to remove implantation damage. Processing continues as is conventional in the art to make contact to the semiconductor devices and source and drain regions with subsequent metallurgy to complete the silicon-on-insulator integrated circuit. For example, FIG. 9 shows dielectric layer 62 overlying the gate electrodes and metal layer 64 contacting the source and drain regions in the n-channel region 14.

Referring now to FIG. 8, the arrows 60 represent the current flow from the source to the drain regions. The body contact regions 50 and 42 do not block the current flow because of the presence of the source/drain extensions 30 and 32. Therefore, the body contact is formed without sacrificing the drain current and without reducing the width of current flow.

Referring now to FIGS. 7, 8, and 9, the silicon-on-insulator body node contacted device of the present invention will be described. The device comprises a semiconductor substrate 10 having an insulator layer 12 thereover. A silicon layer overlying said insulator layer comprises isolation areas 16 between active areas 14 and 15. Adjacent active areas have opposite polarities. Active area 14 is a p-channel area and active area 15 is an n-channel area. A polysilicon gate electrode 20 having a gate oxide 18 thereunder and having silicon oxide sidewalls 22 and dielectric spacers 24 and 28 on its sidewalls overlies each active area. The portion of each active area directly underlying the gate electrode and extending downward to the insulator layer 12 comprises the body node 14 and 15 of the silicon-on-insulator structure. Lightly doped regions 30 and 32 lie within the silicon layer underlying the dielectric spacers. The lightly doped regions act as extensions for the source and drain providing for the current to be collected in the area next to the body contact. Source regions 38 and 52 and drain regions 40 and 44 lie within the silicon layer on either side of the body node. A body node contact 50 and 42 lies within a portion of the source region. Because of the source/drain extensions, the width of the device will not be affected by the presence of the body contact region. A dielectric layer 62 covers the gate electrodes. Metallurgy 64 connects to the source and drain regions of the device, as shown in FIG. 9 and elsewhere in the integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A silicon-on-insulator body node contacted device comprising:

a semiconductor substrate having an insulator layer thereover;

a silicon layer overlying said insulator layer comprising isolation areas between active areas wherein adjacent active areas have opposite polarities;

a polysilicon gate electrode having a gate oxide thereunder and having silicon oxide sidewalls and dielectric spacers on said sidewalls overlying each of said active areas wherein a portion of each of said active areas directly underlying said gate electrode and extending downward to said insulator layer comprises said body node of said silicon-on-insulator body node contacted device;

source and drain regions lying within said silicon layer on either side of said body node in each of said active areas;

a body node contact region replacing a cross-sectional portion of said source region but not said drain region in each of said active areas wherein said body node contact region contacts said body node and wherein said body node contact region has a polarity opposite to the polarity of said source region; and lightly doped regions lying within said silicon layer underlying said dielectric spacers wherein said lightly doped regions do not extend all the way downward to said insulator layer.

2. A silicon-on-insulator body node contacted device comprising:

a semiconductor substrate having an insulator layer thereover;

a silicon layer overlying said insulator layer comprising isolation areas between active areas wherein adjacent active areas have opposite polarities;

a polysilicon gate electrode having a gate oxide thereunder and having silicon oxide sidewalls and dielectric spacers on said sidewalls overlying each of said active areas wherein a portion of each of said active areas directly underlying said gate electrode and extending downward to said insulator layer comprises said body node of said silicon-on-insulator body node contacted device;

source and drain regions lying within said silicon layer on either side of said body node in each of said active areas;

a body node contact region replacing a cross-sectional portion of said source region but not said drain region in each of said active areas wherein said body node contact region contacts said body node and wherein said body node contact region has a polarity opposite to the polarity of said source region; and lightly doped regions lying within said silicon layer underlying said dielectric spacers and having the same polarity as said source and drain regions wherein said lightly doped regions do not extend all the way downward to said insulator layer and wherein said lightly doped regions act as extensions for said source and drain providing for current flowing between said source and said drain to be collected in the area next to said body node contact region.

3. The device according to claim 1 further comprising:

an insulating layer overlying said silicon layer and said polysilicon gate electrodes; and a patterned conducting layer extending downward through said insulating layer to contact said source and drain regions.

4. The device according to claim 1 wherein said adjacent active areas having said opposite polarities comprise a first active area having an N-type polarity and a second active area having a P-type polarity and wherein said body node contact region within said source region of said first active area has a P-type polarity and wherein said body node contact region within said source region of said second active area has an N-type polarity.

5. The device according to claim 2 further comprising:

an insulating layer overlying said silicon layer and said polysilicon gate electrodes; and a patterned conducting layer extending downward through said insulating layer to contact said source and drain regions.

6. The device according to claim 2 wherein said adjacent active areas having said opposite polarities comprise a first active area having an N-type polarity and a second active area having a P-type polarity and wherein said body node contact region within said source region of said first active area has a P-type polarity and wherein said body node contact region within said source region of said second active area has an N-type polarity.

* * * * *